(12) United States Patent
Vandenberghe et al.

(10) Patent No.: US 9,741,416 B1
(45) Date of Patent: Aug. 22, 2017

(54) MEMORY DEVICES BASED ON GATE CONTROLLED FERROMAGNESTISM AND SPIN-POLARIZED CURRENT INJECTION

(71) Applicant: Board of Regents, the University of Texas System, Austin, TX (US)

(72) Inventors: William G. Vandenberghe, Murphy, TX (US); Christopher L. Hinkle, Richardson, TX (US); Massimo V. Fischetti, Richardson, TX (US)

(73) Assignee: Board of Regents, the University of Texas System, Austin, TX (US)

( * ) Notice: Subject to any disclaimer, the term of this patent is extended or adjusted under 35 U.S.C. 154(b) by 0 days.

(21) Appl. No.: 15/263,199

(22) Filed: Sep. 12, 2016

(51) Int. Cl.
  *G11C 11/00* (2006.01)
  *G11C 11/16* (2006.01)
  *H01L 27/22* (2006.01)

(52) U.S. Cl.
  CPC ........ *G11C 11/161* (2013.01); *G11C 11/1673* (2013.01); *G11C 11/1675* (2013.01); *H01L 27/228* (2013.01)

(58) Field of Classification Search
  CPC .............................. G11C 11/00; G11C 11/161
  USPC ...... 365/49.13, 65, 109, 117, 145, 148, 158;
           257/295, E21.208, E21.663, E21.664,
           257/E27.104, E29.164; 438/3
  See application file for complete search history.

(56) References Cited

U.S. PATENT DOCUMENTS

| | | | |
|---|---|---|---|
| 7,453,721 B2 * | 11/2008 | Haratani | B82Y 10/00 257/E21.665 |
| 2006/0240992 A1 * | 10/2006 | Brandt | B82Y 25/00 600/410 |
| 2007/0133263 A1 * | 6/2007 | Haratani | B82Y 10/00 365/158 |
| 2012/0138887 A1 * | 6/2012 | Zhang | H01F 1/401 257/9 |

\* cited by examiner

*Primary Examiner* — Harry W Bryne
(74) *Attorney, Agent, or Firm* — Talem IP Law, LLP

(57) ABSTRACT

Memory devices based on gate controlled ferromagnetism and spin-polarized current injection are provided. The device structure can include a two dimensional (2D) topological insulator (TI) having an active area body. One or a pair of ferromagnetic storage units are provided on top of the 2D TI with a dielectric and a gate thereon. A first contact can be at one end of the 2D TI and a second contact can be at the other end of the 2D TI, with the one or pair of ferromagnetic storage units on the 2D TI between the two contacts to facilitate 2D TI transport along a one-dimensional edge of the first and/or second lateral side. Application of biases via the gate and the first and second contacts enable read and write operations.

9 Claims, 5 Drawing Sheets

MEMORY DEVICES BASED ON GATE CONTROLLED FERROMAGNESTISM AND SPIN-POLARIZED CURRENT INJECTION

This invention was made with government support under Cooperative Agreement number 70NANB12H107 awarded by NIST. The U.S. Government has certain rights in this invention.

BACKGROUND

As transistor dimensions continue to decrease, it has become apparent that scaling silicon-based metal-oxide-semiconductor field-effect-transistors (and related memory devices) is a challenge. It is desirable to maintain electrostatic control and reduce power consumption while maintaining or improving performance. To further the goals towards improved efficiency and performance, various materials and switching mechanisms are being explored, including magnetic-based devices. Two-dimensional (2D) materials, including graphene and monolayer tin (a 2D topological insulator (TI)) are also subject to current research.

BRIEF SUMMARY

Memory devices based on gate controlled ferromagnetism and spin-polarized current injection are provided. These memory devices, referred to herein as gated spin random-access memory (GSRAM) devices, utilize two-dimensional (2D) topological insulators (TIs) and ferromagnets.

A GSRAM device can have a structure that includes a 2D TI having an active area body with a first lateral side and a second lateral side opposite to the first lateral side; a one or a pair of ferromagnetic storage units on top of the 2D TI, one ferromagnetic storage unit of the one or a pair of ferromagnetic storage units being along a portion of the first lateral side of the 2D TI and the other ferromagnetic storage unit of the pair being along a portion of the second lateral side; a dielectric covering the one or a pair of ferromagnetic storage units; and a gate on the dielectric. A first contact can be at one end of the 2D TI and a second contact can be at the other end of the 2D TI, with the one or a pair of ferromagnetic storage units on the 2D TI between the first contact and the second contact to facilitate spin-polarized edge transport along a 1D edge of the first and/or second lateral side. The 2D TI functions as an active layer and can be, but is not limited to, a monolayer of Sn, Bi or Sb, or a transition metal dichalcogenide (TMD) in the distorted octahedral phase (1T' phase). The ferromagnetic material of the ferromagnetic storage units can be, for example, a TMD such as Fe-doped $WSe_2$, but is not limited thereto.

A GSRAM device can be operated using the gate, the first contact, and the second contact. To perform a write operation, a negative gate bias is first applied to reset the device, for example depleting the charge and removing the ferromagnetism in the one or a pair of ferromagnetic storage units. Then, to write a "0", a positive voltage is applied to one of the two contacts (e.g., the first contact), which injects the 2D TI self-selecting spin polarization (as determined by edge state) back into the one or a pair of ferromagnetic storage units. Otherwise, to write a "1", a positive voltage is applied to the other of the two contacts (e.g., the second contact), which injects the 2D TI self-selecting spin polarization (as determined by edge state) back into the ferromagnetic storage units. Upon completion of the spin injection, the biases are removed, storing the "1" or the "0" as defined by the spin-polarization of the injected carriers as predetermined by the edge states. To perform a read operation, a gate bias is applied and the polarity of the bias between the first contact and the second contact is measured. If a "0" is stored, the spin-polarization of the edge states will favor the current flow towards one of the contacts (e.g., the second contact). If a "1" is stored, the spin-polarization of the edge states will favor the current flow towards the other of the contacts (e.g., the first contact).

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DRAWING DESCRIPTION

FIG. 1A shows a lengthwise cross-sectional view of the GSRAM; and FIG. 1B shows a widthwise cross-sectional view of the GSRAM.

DETAILED DESCRIPTION

Memory devices based on gate controlled ferromagnetism and spin-polarized current injection are provided. These memory devices, referred to herein as GSRAM devices, utilize 2D TIs as active layers and ferromagnets as storage layers to provide efficient device operation.

At the very small scale, magnetic memories using conventional technologies do not work efficiently. Magnetic memories that rely on coupling a three-dimensional (3D) topological insulator (TI) to a ferromagnetic storage layer exhibit less than ideal switching efficiencies. 2D TIs have advantages such as higher speed and lower power over their 3D counterparts, and such efficiencies can be taken advantage of by the described memory devices.

Figure 1A:
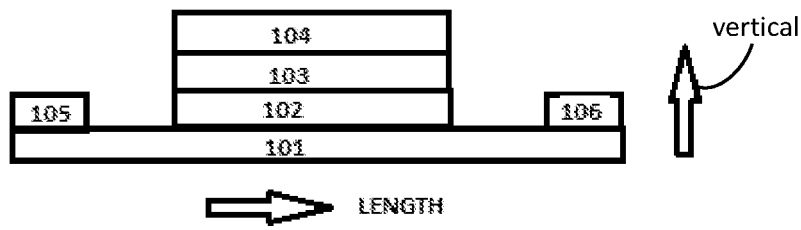
FIGS. 1A and 1B show cross-sectional views of a representational gated spin random access memory (GSRAM) device.
Figure 1B:
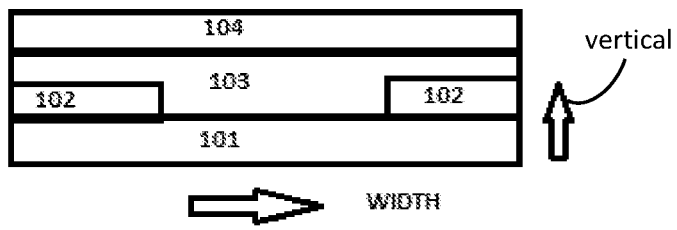
Figure 2:
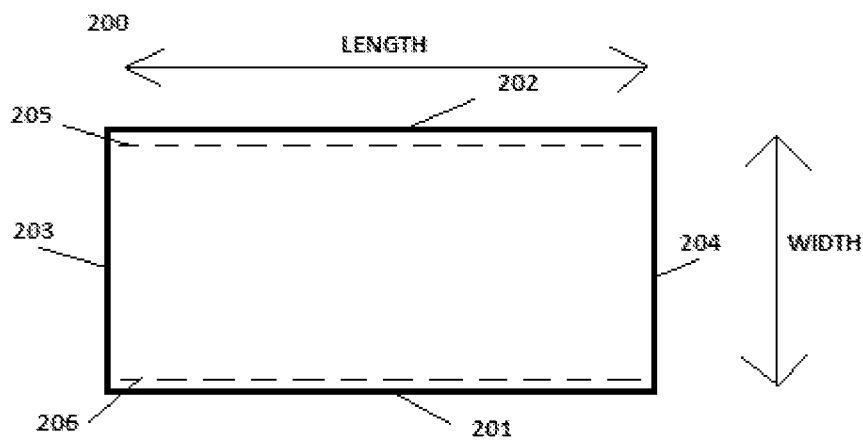
FIG. 2 shows a top view of an active area body for describing physical orientation of a GSRAM device structure.

FIGS. 1A and 1B show cross-sectional views of a representational GSRAM device; and FIG. 2 shows a top view of an active area body for describing physical orientation of a GSRAM device structure. Referring to FIGS. 1A and 1B, the vertical heterostructure of a GSRAM 100 begins with a 2D TI 101 providing an active layer for the memory device. The 2D TI 101 is sometimes also referred to as a quantum Spin Hall insulator. The 2D TI 101 may be a high quality monolayer Sn (tin), for example, grown on a substrate. However, a distorted 1T' phase TMD, or other materials that exhibit properties similar to Sn, such as Bi (Bismuth) or Sb (antimony), may be used as the monolayer for the 2D TI 101. In some cases, the monolayer is functionalized to achieve a larger band-gap 2D TI enabling operation at room temperature. In one example, $F^-$ or $OH^-$ can be attached to monolayer tin to provide functionalization of the monolayer. It should be understood that $F^-$ and $OH^-$ are examples only and other materials can also be used to provide functionalization of the monolayer.

As shown in FIG. 2, the active area body 200 formed by the 2D TI 101 is rectangular in shape with a length and width as identified for the cross-sections of FIGS. 1A and 1B. Of course, other geometries for the 2D layer are possible. The active area body 200 has a first lateral side 201 and a second lateral side 202 opposite the first lateral side 201 (both in length direction).

A pair of ferromagnetic storage units 102 are provided on top of the 2D TI 101. One of the pair of ferromagnetic storage units 102 is provided along a portion of the first lateral side 201 of the 2D TI 101 and the other of the pair of ferromagnetic storage units 102 is provided along a portion of the second lateral side 202 of the 2D TI 101. The pair of ferromagnetic storage units 102 are separated in the width direction since the two storage units are positioned to allow for interaction with respective the edge states of the 2D TI (experienced at the first lateral side 201 and the second lateral side 202). The ferromagnetic storage units 102 can be formed of one or more layers of a 2D ferromagnetic TMD. The one or more 2D ferromagnetic TMD layers may be of the same or different ferromagnetic materials. The 2D ferromagnetic TMD material of the ferromagnetic storage units 102 can be, for example, Fe-doped $WSe_2$ or Fe-doped $MoS_2$.

A dielectric 103 covers the ferromagnetic storage units 102, and a gate 104 is provided on the dielectric 103. A first contact 105 can be at one end 203 of the 2D TI 100 and a second contact 105 can be at the other end 204 of the 2D TI, with the pair of ferromagnetic storage units 102 on the 2D TI 101 between the first contact 105 and the second contact 106 to facilitate 2D TI transport of electrons along a 1D edge of the first lateral side 201 and/or second lateral side 202.

Using a 2D TI as an active layer allows for flow of electrons down the edge states of the 2D TI. For example, electrons (e.g., indicated as element 205) that are transported along the edge at the first lateral side 201 may be spin-up, and electrons (e.g., indicated as element 206) traveling along the edge at the second lateral side 202 may be spin-down. The transport of these electrons occurs only in one dimension (1D) along the lengthwise edges of the 2D TI (e.g., 2D TI 100). As a property of 2D TI edge states, electrons have minimal backscattering, resulting in very fast movement and are effectively 100% spin-polarized. Since the flow of electrons are concentrated along the edges at the first lateral side 201 and the second lateral side 202, a higher efficiency than 3D TIs can be achieved where electrons are transported along a 2D surface. For example, in a 3D TI, the electrons travel all throughout the 2D surface states and are not prevented from scattering. The additional degree for of freedom for the 3D TI surface states compared to the 2D TI edge states reduces overall spin-polarization of the device when applying a bias. In addition, 3D TI devices rely on a spin torque transfer of electrons, which is a weaker effect than a direct injection of spin polarization of electrons along the edge states as described herein.

The GSRAM operates through the introduction (and removal) of spin-polarized electrons into (and out of) the ferromagnetic storage units 102 to write either a "0" or "1" logic state. The logic state written to a ferromagnetic storage unit 102 is dependent on whether the electrons transfer a spin-up or spin-down polarization. This is, in principle, a faster and stronger effect than spin torque transfer. The current from the spin of the electrons moving along the 2D TI edges (e.g., shown as 205 and 206 in FIG. 2) creates a channel. The 2D TI 101 and the ferromagnetic storage units 102 are electrically coupled in the vertical direction, indicated by the "up" arrow in FIGS. 1A and 1B, to enable the flow of electrons between the layers.

Depending on the applied gate bias voltage (applied to gate 104), electrons either will travel along the 1D edges (as 205 and 206) from one or both of the contacts 105, 106 into the ferromagnetic storage layer 102 to enable storage of a particular magnetic polarization of the ferromagnet, or will travel out of the ferromagnetic storage units 102 along the 1D edges (as 205 and 206) to one or both of the contacts 105, 106 so the ferromagnetic storage units 102 become non-ferromagnetic. This process requires less power to perform an operation compared to spin torque transfer. The speed of this operation is also very fast since the speed is only constrained by the time it takes for the electrons to go into or out of the storage device, which is very short because of the quasi-ballistic transport in the edge states in 2D TIs.

FIGS. 3A-3F illustrate GSRAM operation. First, an illustrative GSRAM 300 is shown in a state that may be prior to operation. The GSRAM structure includes contact A 301 and contact B 302 at opposite ends of an active area body of a 2D TI 303. Referring back to FIG. 2, for example, contact A 301 would be located at one end 203 and Contact B would be located at the other end 204. There are two separate ferromagnetic storage units: a first ferromagnetic storage unit 304, which would be considered to be along a portion of a first lateral side 201, and a second ferromagnetic storage unit 305, which would be considered to be along a portion of a second lateral side 202. The positions of the ferromagnetic storage units 304 and 305 enable current to flow from the 2D TI 303 to the ferromagnetic storage units 304 and 305.

A gate dielectric 306 is on top of the ferromagnetic storage units 304 and 305 and can fill the gap between the units 304 and 305. The gate dielectric 306 can be, for example, a high-k dielectric or other type of dielectric. A gate layer 307 is provided on the gate dielectric 306. The gate layer 307 is present for electrostatic control of the GSRAM. Depending on the desired operation, the ferromagnetic state of the memory device can be controlled by the voltage applied to the gate layer 307 to drive the charge either out of or into the ferromagnetic storage units 304 and 305. As can be seen from the legend in the FIG. 3A, the GSRAM state indicates that the ferromagnetic storage units 304 and 305 are magnetized and have a spin polarization in both directions, where storage unit 304 is indicated as being polarized in one direction with the up arrow and storage unit 305 is indicated as being polarized in the opposite direction with the down arrow. In addition, the potential energy is shown to be about the same between contact A 301, the gate layer 307, and contact B 302 by the flat line in the legend.

The GSRAM device 300 can be operated using the gate 307, the first contact (e.g., contact A 301), and the second contact (e.g., contact B 302). FIGS. 3B-3E illustrate write operations. The write operation entails three steps, or states, —reset, inject, and store. FIG. 3B shows the reset state, FIGS. 3C and 3D show the two inject states—one for storing a "0" and the other for storing a "1", and FIG. 3E shows the store state after the inject state for storing a "0".

Turning first to FIG. 3B, to carry out a reset operation, a negative bias voltage is applied to reset the device, for example by applying a voltage to the gate layer 307. As can be seen by the legend in FIG. 3B, the potential energy at the gate layer 307 is higher than at contact A 301 and contact B 302. By applying a negative bias, the electrons that provide ferromagnetism are driven out of the ferromagnetic storage units 304 and 305, resulting in depletion of the charge and removal of the ferromagnetism in the ferromagnetic storage units 304, 305. The electrons that are driven out of the ferromagnetic storage layers travel down the 1D edge states of the 2D TI 303 and continue traveling to contact A 301 or contact B 302. Here, the electrons from the first ferromagnetic storage unit 304 travel to the contact A 301 with spin down state (with the spin up state directed to the contact B 302) and the electrons from the second ferromagnetic storage unit 305 travel to contact B 302 with spin down state (with the spin up state directed to contact A 301). Though not shown in the figure, contact A 301 and contact B 302 are connected to a voltage source. The electrons travel out of the contacts and flow into the voltage source.

Next, an injection operation is carried out to write either a "0" or a "1". FIG. 3C shows the operation of writing a "0" to the GSRAM 300. To write a "0", a positive voltage is applied to the first contact (e.g., contact A 301), which injects the 2D TI self-selecting spin polarization (determined by edge states) back into the ferromagnetic storage units 304, 305. In this operation, both the gate layer 307 and contact A 301 are applied with a voltage to effectively bring electrons back to the ferromagnetic storage units 304, 305. Using the properties of the 2D TI, the magnetization direction of the storage layers (304 and 305) by applying the positive voltage to contact A 301 (in other words, writing a "0") will be defined by the polarization of the injected electrons as pre-determined by the edge states. In the illustrated example, these injected electrons can only travel from contact A 301 towards contact B 302, and will have spin-up polarization in the fixed edge state areas 308 along the side to the first storage unit 304 and spin-down polarization in the fixed edge state areas 309.

Similarly, FIG. 3D shows the operation of writing a "1" to the GSRAM 300. To write a "1", a positive voltage is applied to the second contact (e.g., contact B 302), which injects the 2D TI self-selecting spin polarization (determined from edge states) back into the ferromagnetic storage units 304, 305. In this operation, both the gate layer 307 and the contact B 302 are applied with a voltage to effectively bring electrons back to the ferromagnetic storage units 304, 305. The magnetization direction of the ferromagnetic storage layers (304 and 305) by applying the positive voltage to contact B 302 (in other words writing a "1") will be defined by the polarization of the injected electrons as pre-determined by the edge states. In the illustrated example, these injected electrons can only travel from contact B 302 to contact A 301, and will have spin-down polarization in the fixed edge state areas 310 along the side to the first storage unit 304 and spin-up polarization in the fixed edge state areas 311.

Upon completion of the spin injection, the biases are removed, storing the "1" or the "0" as defined by the spin-polarization of the injected carriers as predetermined by the edge states. For example, as shown in the store state of a "0" illustrated in FIG. 3E, the ferromagnetic storage units 304 and 305 are now ferromagnetic due to the injection of electrons from the step illustrated in FIG. 3C. The legend in FIG. 3E shows the contact A 301, gate layer 307, and contact B 302 at the same potential energy (since no biases are applied), and the first ferromagnetic storage unit 304 having a spin-up polarization. The location of the stored information is dependent on whether a "0" or "1" is written. The data stored in the storage layers is non-volatile and can be stored indefinitely.

To perform a read operation, a gate bias is applied and the polarity of the bias between the first contact and the second contact is measured. If a "0" is stored, the spin-polarization of the edge states will favor the current flow towards one of the contacts (e.g., contact B 302). If a "1" is stored, the spin-polarization of the edge states will favor the current flow towards the other of the contacts (e.g., contact A 301).

Figure 3A:
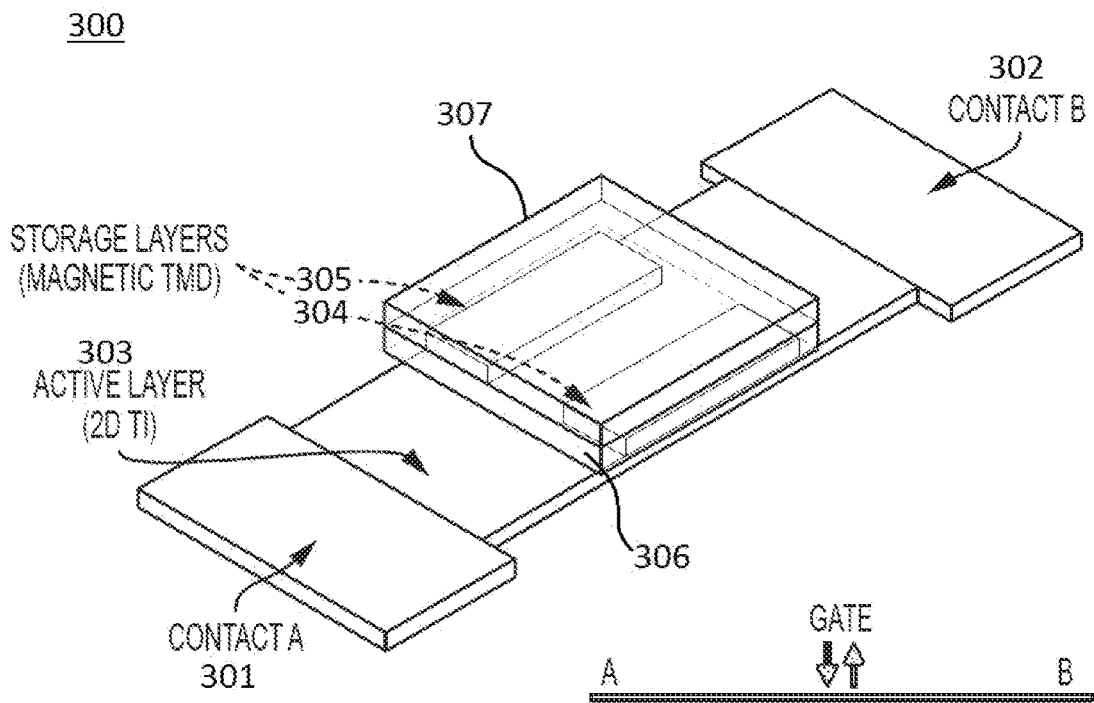
FIGS. 3A-3F illustrate GSRAM operation.
Figure 3B:
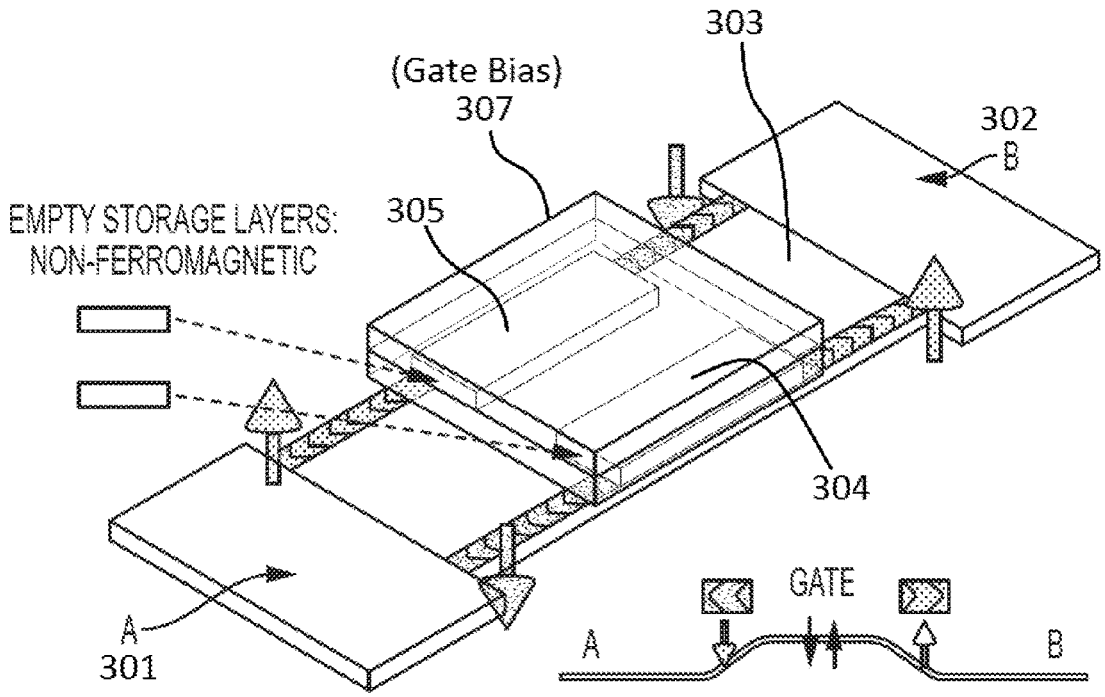
Figure 3C:
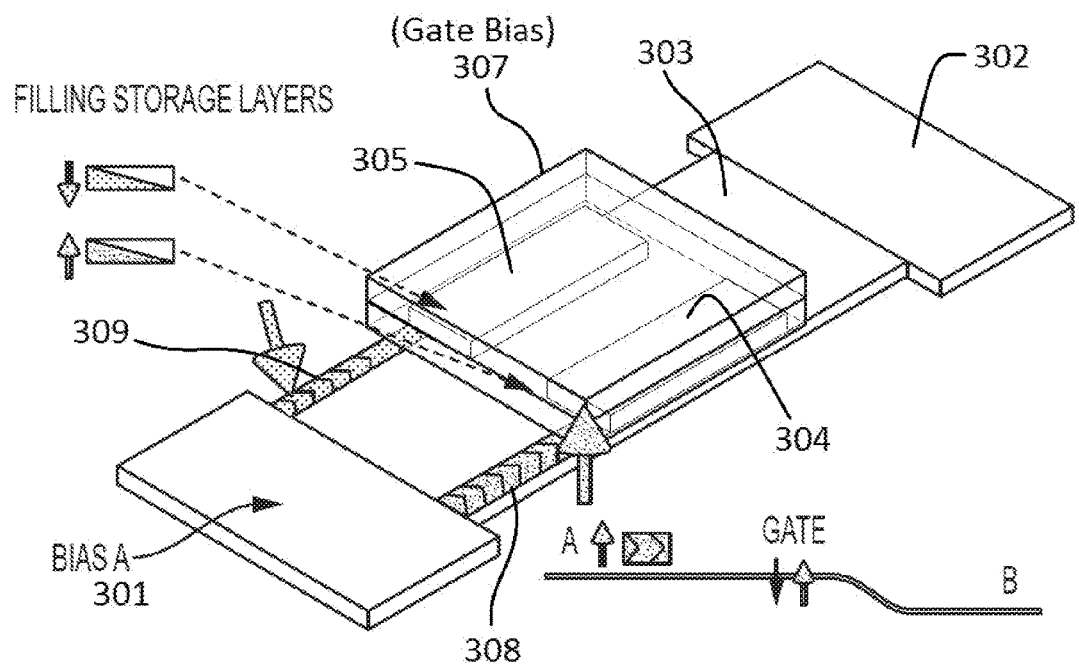
Figure 3D:
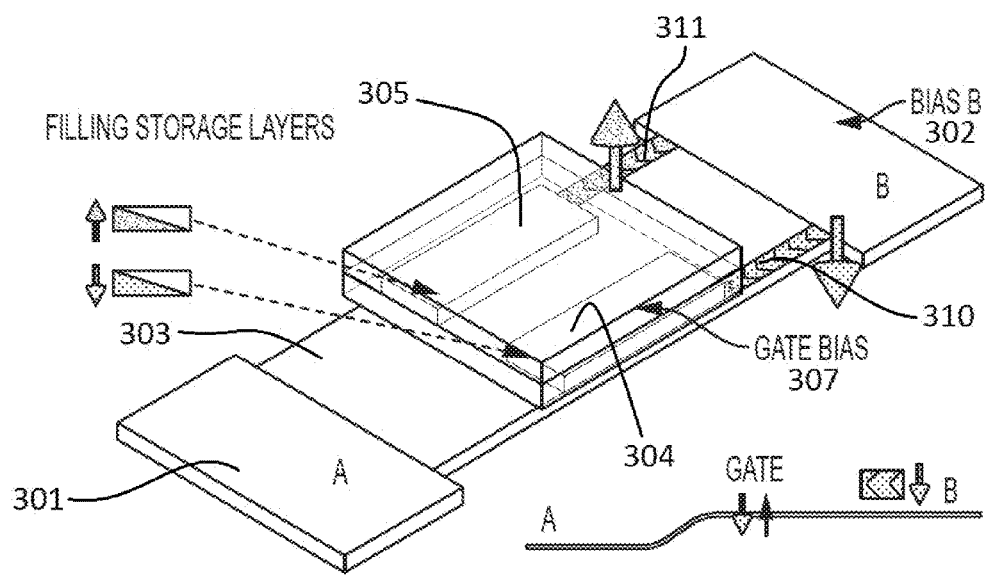
Figure 3E:
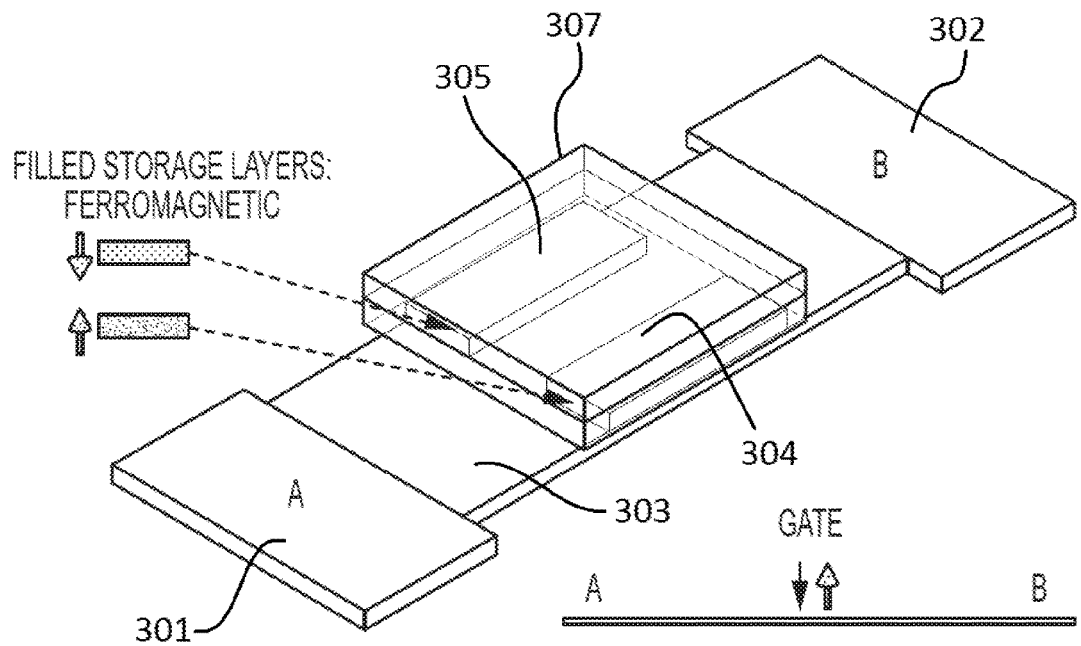
Figure 3F:
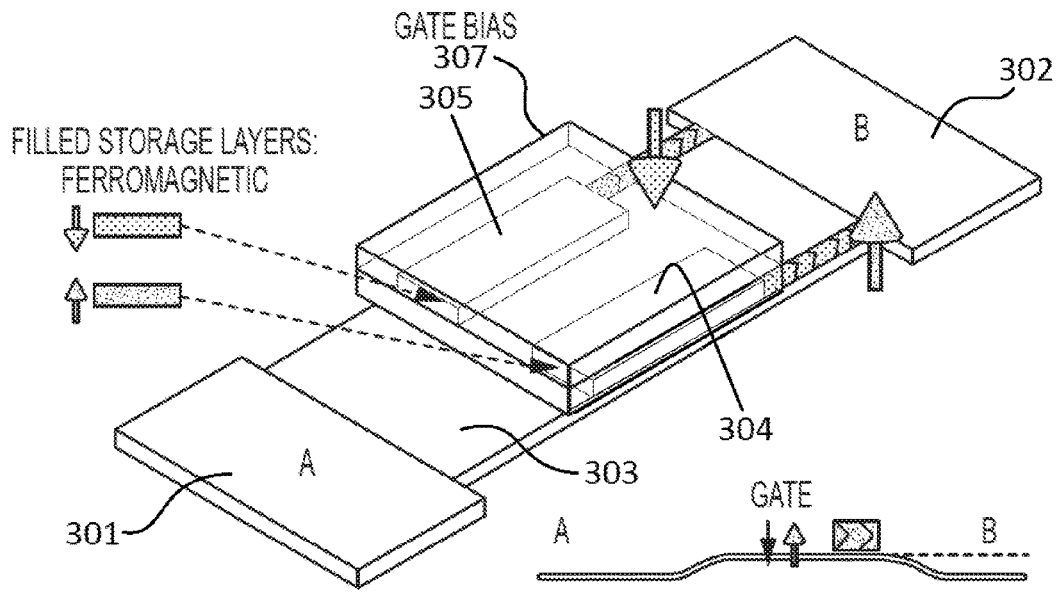

FIG. 3F shows the read operation of the GSRAM 300. To perform the read operation, a small bias voltage is applied to the gate layer 307. The application of the gate bias voltage will send the spin polarized electrons back down the spin polarized edge states of the 2D TI 303 toward either contact A 301 or contact B 302, depending on the polarization. In this way, the GSRAM self-selects the contact to which the electrons can travel based on the properties of the 2D TI discussed above. In this example, since the storage unit 304 has the spin-up polarization, the electrons travel to contact B 302. This flow of electrons creates a potential energy difference between the contacts, as shown by the dotted lines in the legend in FIG. 3F. This potential energy difference can be readily detected by measuring the polarity of the bias between contacts A and B ($V_{AB}$) at room temperature. The magnitude of the bias between contacts A and B will be similar to the applied gate bias.

Advantageously, the GSRAM can be read at room temperature. Most other magnetic memories cannot be measured at room temperature because they rely on a conventional magnetic interaction, the strength of which is too small at the nanoscale to be measured at room temperature (i.e. energy scales less than 25 meV). Conversely, the GSRAM relies on the spin-orbit interaction which is strong, even at the nanoscale. For example, in monolayer-tin-based 2D TIs, the spin-orbit interaction opens up a bandgap >300 meV. In contrast, the conventional magnetic energy of two electrons removed 1 nm from each other is of the order of 0.01 meV.

Figure 4:
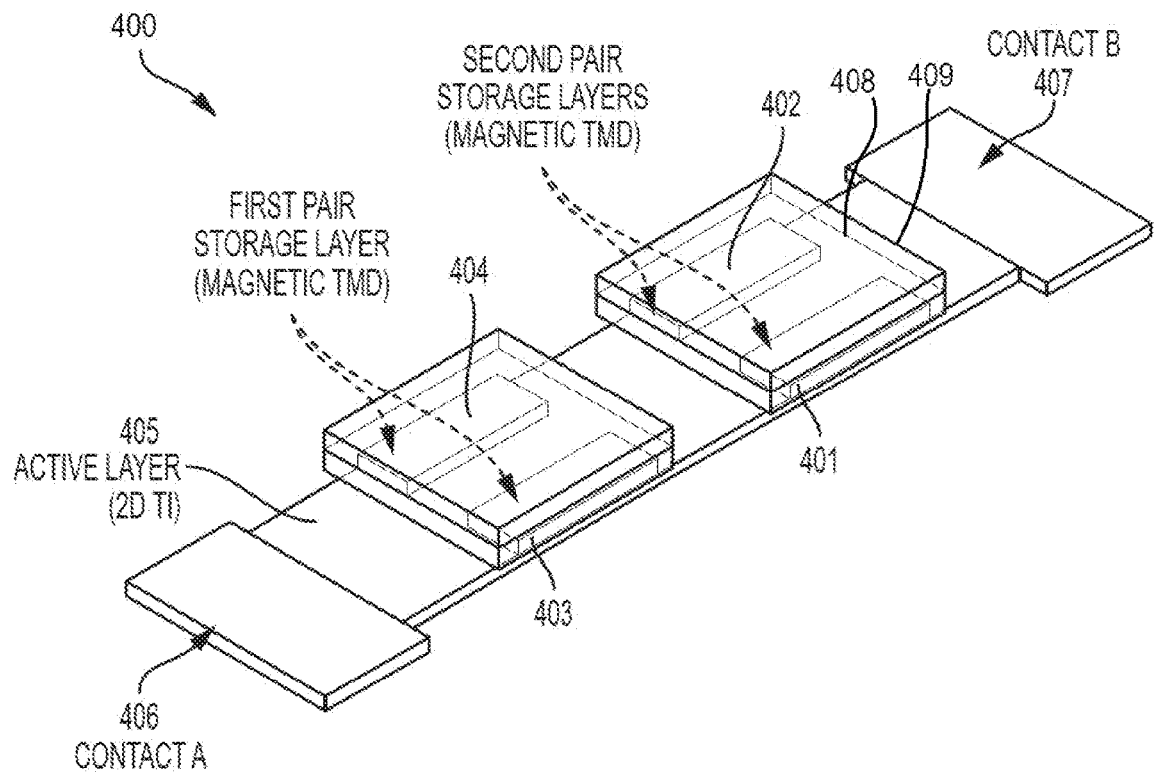
FIG. 4 shows an example of a GSRAM with additional memory states.

In another embodiment, additional ferromagnetic storage layers can be fabricated onto the 2D TI to store additional memory states. FIG. 4 shows an example of a GSRAM 400 with additional memory states. In this example, two additional memory states are shown, however, more memory states can be added as well. Additional states are realized by the inclusion of a second pair of ferromagnetic storage units 401 and 402 (which are in addition to the first pair of ferromagnetic storage units 403 and 404) along the lateral sides of the 2D TI 405 between the two contacts 406 and 407. A second gate dielectric 408 is on the second pair of ferromagnetic storage units 401 and 402, and a second gate layer 409 is on the second gate dielectric 408. It is important to note that, in this configuration, voltage applied to contacts A 406 and B 407 will control the spin polarization of the electrons for all pairs of ferromagnetic storage units. More states can be realized by adding pairs of ferromagnetic storage units.

Figure 5:
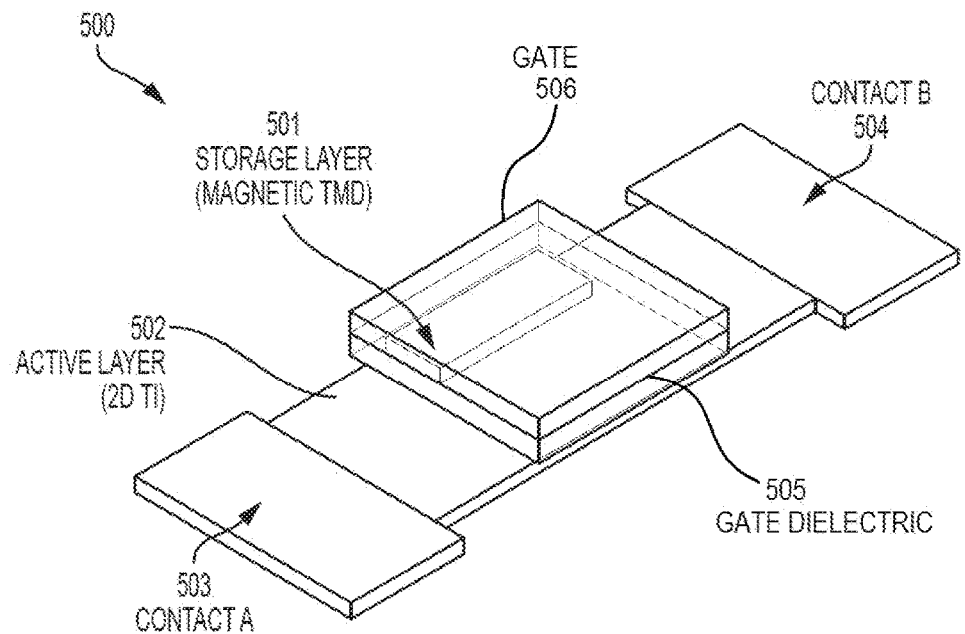
FIG. 5 shows an example of a GSRAM with one storage layer.

In another embodiment, a GSRAM with one storage layer can also be realized. FIG. 5 shows an example of a GSRAM 500 with one storage layer. In this example, a single ferromagnetic storage unit 501 is along a lateral side of the 2D TI 502 between the two contacts 503 and 504. A gate dielectric 505 is on the ferromagnetic storage unit 501, and a gate electrode 506 is on the gate dielectric 505. Operation of the GSRAM 500 with single storage layer can be accomplished in a similar manner as described above with respect to the pair of storage layers. It is possible that, with just a single unit, there can be potentially higher parasitic current along the edge without a storage layer.

Theoretical Example

A GSRAM structure such as shown in FIG. 3A was modeled based on a size of a 20 nm×20 nm chip. Assuming the ferromagnetic layer(s) (e.g., storage units 304 and 305 of FIG. 3A) are 11% Fe-doped $WSe_2$, if the depletion of 1 electron for each Fe atom in the ferromagnetic layer removed ferromagnetism, then each ferromagnetic layer (e.g., of storage units 304 and 305) would contain ~500 Fe dopants corresponding to a charge density of $8 \times 10^3$ $cm^{-2}$. This theoretical value is high, yet still within the range of achievable charge concentrations. It should be noted that lower Fe concentrations would reduce this requirement.

There are several advantages to the GSRAM described above, which can be found through an estimation of its switching speed and power consumption. A single ballistic channel, i.e. the TI edge state, biased at 0.1 eV can provide the 500 electrons required to switch the magnet in 20 picoseconds (500×h/0.1 eV) compared to nanosecond switching for present-day non-volatile memory as well as spin-transfer torque devices (STT-RAM). The lower limit on the energy required for switching would be ~10 aJ, which is orders of magnitude lower than present-day memory devices.

It should be understood that the examples and embodiments described herein are for illustrative purposes only and that various modifications or changes in light thereof will be suggested to persons skilled in the art and are to be included within the spirit and purview of this application.

What is claimed is:

1. A memory device comprising:
   a two-dimensional (2D) topological insulator (TI) having an active area body with a first lateral side and a second lateral side opposite to the first lateral side;
   a pair of ferromagnetic storage units on top of the 2D TI, a first ferromagnetic storage unit of the pair of ferromagnetic storage units being on top of the 2D TI along a portion of the first lateral side of the 2D TI and a second ferromagnetic storage unit of the pair of ferromagnetic storage units being on top of the 2D TI along a portion of the second lateral side of the 2D TI;
   a gate dielectric layer on the pair of ferromagnetic storage units; and
   a gate layer on the gate dielectric layer.

2. The memory device of claim 1, further comprising:
   a first contact at one end of the 2D TI; and
   a second contact at an opposite end of the 2D TI, wherein the pair of ferromagnetic storage units are on the 2D TI between the first contact and the second contact.

3. The memory device of claim 1, wherein the 2D TI comprises Sn.

4. The memory device of claim 1, wherein the 2D TI comprises Sb.

5. The memory device of claim 1, wherein the 2D TI comprises Bi.

6. The memory device of claim 1, wherein the 2D TI comprises a distorted octahedral transition metal dichalcogenide (TMD).

7. The memory device of claim 1, wherein the ferromagnetic material of the pair of ferromagnetic storage units comprises Fe-doped $WSe_2$.

8. The memory device of claim 1, wherein the ferromagnetic material of the pair of ferromagnetic storage units comprises Fe-doped $MoS_2$.

9. The memory device of claim 1, further comprising:
   a second pair of ferromagnetic storage units on top of the 2D TI between the first pair of ferromagnetic storage units and one of either the first contact or the second contact;
   a second gate dielectric layer on the second pair of ferromagnetic storage units; and
   a second gate layer on the second gate dielectric layer.

* * * * *